US012626889B2

(12) United States Patent
Bassett et al.

(10) Patent No.: US 12,626,889 B2
(45) Date of Patent: May 12, 2026

(54) PLASMA PROCESSING METHOD AND APPARATUS

(71) Applicant: Tokyo Electron Limited, Tokyo (JP)

(72) Inventors: Derek William Bassett, Austin, TX (US); Jeffrey Lauerhaas, Chaska, MN (US); Lance Van Elsen, Chaska, MN (US)

(73) Assignee: Tokyo Electron Limited, Tokyo (JP)

( * ) Notice: Subject to any disclaimer, the term of this patent is extended or adjusted under 35 U.S.C. 154(b) by 229 days.

(21) Appl. No.: 18/328,345

(22) Filed: Jun. 2, 2023

(65) Prior Publication Data

US 2024/0404794 A1     Dec. 5, 2024

(51) Int. Cl.
H01J 37/32        (2006.01)

(52) U.S. Cl.
CPC .. H01J 37/32449 (2013.01); H01J 37/32834 (2013.01); H01J 2237/1825 (2013.01); H01J 2237/3341 (2013.01)

(58) Field of Classification Search
None
See application file for complete search history.

(56) References Cited

U.S. PATENT DOCUMENTS

| | | | | |
|---|---|---|---|---|
| 5,424,103 A * | 6/1995 | Ahn | .......................... | C23C 16/34 |
| | | | | 257/E21.279 |
| 2003/0057848 A1* | 3/2003 | Yuasa | ............... | H01J 37/32192 |
| | | | | 315/111.71 |

| | | | | |
|---|---|---|---|---|
| 2004/0050685 A1* | 3/2004 | Yara | ......................... | C23C 16/50 |
| | | | | 422/186.04 |
| 2004/0173316 A1* | 9/2004 | Carr | ...................... | C23C 16/511 |
| | | | | 156/345.35 |
| 2014/0374509 A1 | 12/2014 | Detmar et al. | | |
| 2016/0329192 A1 | 11/2016 | Sieber et al. | | |
| 2016/0329193 A1* | 11/2016 | Sieber | ...................... | H05H 1/46 |
| 2017/0330773 A1 | 11/2017 | Chang et al. | | |
| 2020/0234931 A1 | 7/2020 | Tamamushi | | |

FOREIGN PATENT DOCUMENTS

| | | | |
|---|---|---|---|
| WO | 2023055836 A1 | 4/2023 | |

OTHER PUBLICATIONS

International Search Report and Written Opinion, PCT/US2024/025035, Mailed Jul. 31, 2024, Total pp. 9.

* cited by examiner

*Primary Examiner* — Ram N Kackar
(74) *Attorney, Agent, or Firm* — Slater Matsil, LLP

(57) ABSTRACT

An embodiment plasma processing apparatus includes a plasma generation source, a nozzle in a plasma chamber, the nozzle being able to direct plasma from the plasma generation source to a wafer that is to be processed, the plasma having the form of a plasma stream at an exit of the nozzle, an outer annulus disposed in the plasma chamber and over the wafer, the outer annulus surrounding the nozzle, a gas exhaust disposed between inner sidewalls of the outer annulus and outer sidewalls of the nozzle, and a first vacuum pump connected to the gas exhaust between the inner sidewalls of the outer annulus and the outer sidewalls of the nozzle.

20 Claims, 9 Drawing Sheets

PLASMA PROCESSING METHOD AND APPARATUS

TECHNICAL FIELD

The present invention relates generally to plasma processing, and, in particular embodiments, a plasma processing method and apparatus.

BACKGROUND

Semiconductor fabrication processes may involve various manufacturing techniques including formation, patterning and removing a number of layers over a substrate. Plasma processes are commonly used in various steps of semiconductor fabrication processes. For example, reactive ion etching (RIE), plasma-enhanced CVD (PECVD) and plasma-enhanced atomic layer deposition (PEALD) are common process steps in the fabrication of semiconductor devices.

Semiconductor wafer die fabrication processes may also include a variety of processes that are used for wafer thinning and planarization. Chemical mechanical planarization (CMP) is a process that can be used for thinning and planarizing an entire wafer, but is not very capable of controllably thinning localized regions of the wafer.

A localized or partial plasma etch can be used to remove material in a specific region of a wafer using a plasma, while leaving behind material in other surrounding regions of the wafer. As the plasma processes in the semiconductor industry further advance, there is a need to improve the existing plasma etching processes. These improvements are needed to lower etch damage from uncontrolled plasma flows to the surrounding regions of the wafer during the localized or partial plasma etch. Improvements are also needed to allow for better control of etching across the surface of the wafer resulting in improved uniformity across the wafer.

SUMMARY

In accordance with an embodiment, a plasma processing apparatus comprises a plasma generation source, a nozzle in a plasma chamber, the nozzle being able to direct plasma from the plasma generation source to a wafer that is to be processed, the plasma having the form of a plasma stream at an exit of the nozzle, an outer annulus disposed in the plasma chamber and over the wafer, the outer annulus surrounding the nozzle, a gas exhaust disposed between inner sidewalls of the outer annulus and outer sidewalls of the nozzle, and a first vacuum pump connected to the gas exhaust between the inner sidewalls of the outer annulus and the outer sidewalls of the nozzle.

In accordance with an embodiment, a method of plasma processing comprises generating a plasma from a plasma source, directing the plasma into a processing chamber and to an outer surface of a wafer using a nozzle, the plasma exiting at an end of the nozzle disposed above the outer surface of the wafer, the plasma exiting in the form of a plasma stream, the nozzle extending through a gas shroud that surrounds the nozzle and that is disposed over the wafer, a gas exhaust being disposed between inner sidewalls of the gas shroud and outer sidewalls of the nozzle, maintaining a first pressure in the gas exhaust using a first vacuum pump; and maintaining a second pressure in the processing chamber using a second vacuum pump, the first pressure and the second pressure being different.

In accordance with an embodiment, an apparatus comprises a plasma source, and a gas shroud disposed over a wafer to be processed in a processing chamber, the gas shroud having a concave shape with a flat center portion, a nozzle extending through a first opening in the flat center portion, the nozzle being configured to deliver plasma from the plasma source to an outer surface of the wafer, and a plurality of exhaust outlets extending from second openings in the flat center portion, the plurality of exhaust outlets being radially disposed around the nozzle.

The foregoing has outlined rather broadly the features and technical advantages of the present disclosure in order that the detailed description of the disclosure that follows may be better understood. Additional features and advantages of the disclosure will be described herein, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an apparatus and method for localized or partial plasma etching that includes a nozzle that directs plasma and reactive species (e.g., ions, electrons, radicals, or the like) from a plasma source towards a wafer to be etched. The plasma is directed in the form of a plasma stream at the nozzle exit. The wafer to be etched and the nozzle exit may be in a plasma chamber. The apparatus and method may include a gas annulus that is fitted around the nozzle. In alternate embodiments, the apparatus and method may include a gas shroud instead of the gas annulus, the nozzle being fitted into and surrounded by the gas shroud. When an inlet pressure in the nozzle, an outlet pressure in the gas annulus (or the gas shroud), and a chamber pressure in the plasma chamber are properly calibrated, the gas annulus (or gas shroud) functions as an outlet or vent (e.g., an exhaust) through which unreacted plasma, gases and by-products generated during plasma processing of the wafer are removed from the plasma chamber.

Advantages can be achieved by properly calibrating the inlet pressure in the nozzle, the outlet pressure in the gas annulus (or gas shroud), and the chamber pressure in the plasma chamber such that the gas annulus (or gas shroud) functions as an outlet or vent (e.g., an exhaust) for the unreacted plasma to leave the plasma chamber. This includes the ability to control plasma flow after impacting the wafer, which results in the unreacted plasma interacting with only a reduced area (e.g., a first region) of a top surface of the wafer. This will therefore allow for high-resolution etching, better uniformity across the surface of the wafer, and reduced etch damage from the unreacted plasma to surrounding regions (e.g., other regions that surround the first region) of the wafer during the partial plasma etch. Hereinafter, various embodiments will be explained in detail with reference to the accompanying drawings.

Figure 1:
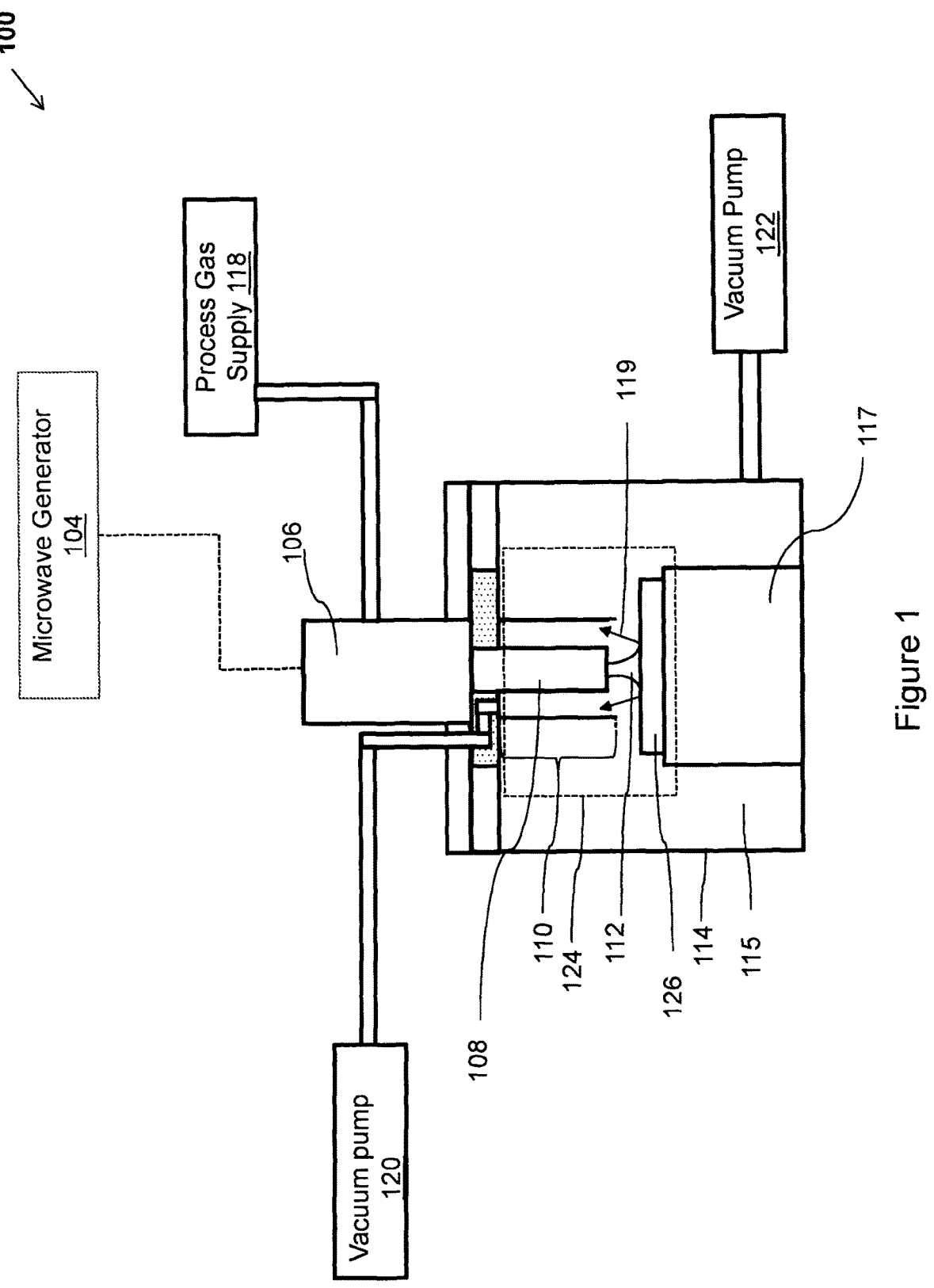
FIG. 1 illustrates a block diagram of a plasma processing system, in accordance with various embodiments of the present disclosure.

FIG. 1 illustrates a schematic cross-sectional view of an example of a plasma processing system 100 in accordance with the technology described herein. Depending upon the implementation, the plasma processing system 100 may be a capacitively coupled plasma (CCP) processing system, inductively coupled plasma (ICP) processing system, microwave-generated plasma system, or the like. The plasma processing system 100 is described subsequently for use in the context of etching operations. However, aspects of the embodiments described herein may be used for other plasma operations including ashing, deposition, cleaning, plasma polymerization, plasma-enhanced chemical vapor deposition (PECVD), plasma-enhanced atomic layer deposition (PEALD) and so forth. Plasma processing can be executed within a plasma processing chamber 114, which can be a vacuum chamber made of a metal such as aluminum, stainless steel, or the like.

The plasma processing system 100 may use a high-voltage radio-frequency (RF) electrical source to aid in the generation of a plasma. The RF electrical source may be a high-frequency (HF) source, microwave source, or the like. In FIG. 1, a microwave generator 104 is shown that generates electromagnetic waves (microwaves) that are distributed to a plasma source 106 in which plasma is generated. The plasma source 106 is disposed above the plasma processing chamber 114, and may comprise a plasma cavity and a plasma element (e.g., one or more electrodes) that are used to produce and sustain plasma in the plasma cavity. In an embodiment, the plasma source 106 may be a remote plasma source that is disposed in a different location, with the plasma being directed to a surface to be etched after being generated. The plasma element may produce plasma which then flows into the plasma processing chamber 114 through a nozzle 108. The plasma is therefore generated outside of the plasma processing chamber 114 and then introduced into the plasma processing chamber using a gas flow.

A process gas is introduced into the plasma cavity of the plasma source 106, where it is ionized and excited by the plasma. This gas may be a mixture of one or more reactive gases, such as oxygen, nitrogen, hydrogen, fluorine, or the like, depending on the specific process being performed. The process gas is supplied using a process gas supply 118, and is introduced into the plasma cavity through a gas inlet. The process gas may be mixed with a carrier gas, such as argon or helium, to ensure uniform distribution and stable plasma operation. The gas mixture is then energized by the plasma, which dissociates the gas molecules into reactive species such as radicals, ions, or excited molecules.

The plasma and reactive species generated in the plasma source 106 then flow into the plasma processing chamber 114 through the nozzle 108, and an exit of the nozzle 108 is positioned over a wafer support 117 (e.g., a wafer vacuum chuck, or the like) in the plasma processing chamber 114. The wafer support 117 is configured to hold a wafer 126 (or for example, a substrate, or the like) to be etched, so that the reactive species and the plasma are ejected from the exit of the nozzle 108 towards a top surface of the wafer 126. In an embodiment, the wafer support 117 is capable of rotating the wafer 126 while an etch process is being performed on the wafer 126. The plasma and the reactive species are directed towards the top surface of the wafer 126 in the form of a plasma stream 112 at the exit of the nozzle 108. The plasma stream 112 comprises a narrow column or stream of plasma and reactive species. The nozzle 108 (which may also be referred to subsequently as the inner annulus) comprises a tube or pipe with an annular cross-section. For example, the nozzle 108 may comprise a hollow cylindrical structure with a circular cross-section, with an open space or hole in the center, resulting in a ring-shaped cross-section. The nozzle 108 may have an outer diameter D1 between outermost sidewalls of the nozzle 108. The nozzle 108 may have an internal diameter D2 (shown subsequently in FIG. 2) between innermost sidewalls of the nozzle 108. In an embodiment, the internal diameter D2 of the nozzle 108 is constant through the length of the nozzle 108. In an embodiment, the nozzle 108 may comprise a material that is unreactive or inert to the plasma it delivers towards a top surface of the wafer 126. For example, the nozzle 108 may comprise sapphire, tungsten, or a ceramic (e.g., silicon carbide, alumina, yttria, or the like).

The plasma processing system 100 may also comprise an outer annulus 110. The outer annulus 110 comprises a tube or pipe with an annular cross-section. For example, the outer annulus 110 may comprise a hollow cylindrical structure with a circular cross-section, with an open space or hole in the center, resulting in a ring-shaped cross-section. The nozzle 108 is disposed inside the outer annulus 110, such that the outer annulus surrounds the nozzle 108. The outer annulus 110 may have an outer diameter D3 between outermost sidewalls of the outer annulus 110, where the outer diameter D3 is larger than the outer Diameter D1. The outer annulus 110 may have an internal diameter D4 (shown subsequently in FIG. 2) between innermost sidewalls of the outer annulus 110, where the internal diameter D4 is larger than the outer diameter D1. The nozzle 108 is disposed inside the outer annulus 110 such that a gas exhaust 109 is formed between the inner sidewalls of the outer annulus 110 and the outer sidewalls of the nozzle 108. The gas exhaust 109 comprises a space or gap between the inner sidewalls of the outer annulus 110 and the outer sidewalls of the nozzle 108. The gas exhaust 109 surrounds a perimeter of the outer sidewalls of the nozzle 108. In an embodiment, unreacted plasma (and reactive species), as well as gases and by-products generated during plasma processing of the wafer 126 are removed from the plasma processing chamber 114 through the gas exhaust 109. In an embodiment, the outer annulus 110 may comprise a material such as stainless steel, a ceramic (e.g., alumina, silicon carbide, yitria), or the like.

A vacuum pump 120 is connected to the gas exhaust 109 between the outer annulus 110 and the nozzle 108, and is used to remove unreacted plasma (and reactive species), as well as gases and by-products generated during plasma processing of the wafer 126 up through the gas exhaust 109 and out of the plasma processing chamber 114 through a gas outlet. The gas exhaust 109 between the inner sidewalls of the outer annulus 110 and the outer sidewalls of the nozzle 108 is therefore an outlet or exhaust through which unreacted plasma (and reactive species), as well as gases and by-products generated during plasma processing of the wafer are removed from the plasma processing chamber 114.

During an etching process using the plasma processing system 100, the wafer 126 can be moved or scanned under the plasma stream 112 in order to etch material from the wafer 126. The wafer scan speed and dwell time during the etching process can be controlled to control uniformity across the wafer 126, and to allow for uniform etching across the entire surface of the wafer 126.

A vacuum pump 122 is connected to the plasma processing chamber 114 through a gas outlet, and the vacuum pump 122 helps to maintain a desired pressure in regions 115 of the plasma processing chamber 114.

Figure 2:
FIG. 2 illustrates a cross-sectional view of a region of the plasma processing system that was shown in FIG. 1, in accordance with various embodiments of the present disclosure.

FIG. 2 shows a cross-sectional view of a region 124 of the plasma processing system 100 that was shown previously in FIG. 1. The outer annulus 110 and the nozzle 108 are shown as being disposed over the wafer 126. Specifically, the nozzle 108 and the outer annulus 110 are disposed to be over an area of the wafer 126 that is to be etched. The outer annulus 110 may comprise a material such as stainless steel, a ceramic (e.g., alumina, silicon carbide, yitria), or the like. The nozzle 108 may comprise a material such as sapphire, tungsten, a ceramic (e.g., silicon carbide, alumina, yttria), or the like. It should be noted that even though the outer annulus 110 and the nozzle 108 are described as being used in context of an etching process, the embodiments described herein (including the outer annulus 110 and the nozzle 108)

may be used in the context of other types of plasma operations. These operations include ashing, deposition, cleaning, plasma polymerization, plasma-enhanced chemical vapor deposition (PECVD), plasma-enhanced atomic layer deposition (PEALD) and so forth.

As illustrated in various embodiments, the nozzle 108 (which may also be referred to subsequently as the inner annulus) comprises a tube or pipe with an annular cross-section. For example, the nozzle 108 may comprise a hollow cylindrical structure with a circular cross-section, with an open space or hole in the center, resulting in a ring-shaped cross-section. The nozzle 108 may have the outer diameter D1 between outermost sidewalls of the nozzle 108. The nozzle 108 may have the internal diameter D2 between innermost sidewalls of the nozzle 108. In an embodiment, the outer diameter D1 is in a range from 6 mm to 25 mm, and the internal diameter D2 is in a range from 5 mm to 20 mm. The outer annulus 110 comprises a tube or pipe with an annular cross-section. For example, the outer annulus 110 may comprise a hollow cylindrical structure with a circular cross-section, with an open space or hole in the center, resulting in a ring-shaped cross-section. The nozzle 108 is disposed inside the outer annulus 110, such that the outer annulus surrounds the nozzle 108. The axis (also referred to subsequently as the length) of the nozzle 108 is disposed vertically inside the outer annulus 110. The outer annulus 110 may have the outer diameter D3 between outermost sidewalls of the outer annulus 110, where the outer diameter D3 is larger than the outer Diameter D1. The outer annulus 110 may have the internal diameter D4 between innermost sidewalls of the outer annulus 110, where the internal diameter D4 is larger than the outer diameter D1. In an embodiment, the outer diameter D3 may be in a range from 8 mm to 40 mm, and the internal diameter D4 is in a range from 7 mm to 30 mm.

The outer annulus 110 may be disposed such that bottommost surfaces of the outer annulus 110 are below bottommost surfaces (e.g., an exit) of the nozzle 108. In this way, the bottommost surfaces of the outer annulus 110 are closer to a top surface of the wafer 126 than the bottommost surfaces of the nozzle 108, and bottom portions of sidewalls of the outer annulus 110 may be below sidewalls of the nozzle 108. For example, the bottommost surface (e.g., the exit) of the nozzle 108 may be above the top surface of the wafer 126 by a height H1 that is in a range from 0.5 mm to 20 mm. The bottommost surface of the outer annulus 110 may be above the top surface of the wafer 126 by a height H2 that is in a range from 0.5 mm to 20 mm. In an alternate embodiment, the height H1 and the height H2 are equal. The nozzle 108 is disposed inside the outer annulus 110 such that a gas exhaust 109 is formed between the inner sidewalls of the outer annulus 110 and the outer sidewalls of the nozzle 108. The gas exhaust 109 surrounds a perimeter of the outer sidewalls of the nozzle 108.

The plasma and reactive species which flow into the plasma processing chamber 114 from the plasma source 106 travel through the nozzle 108. The exit of the nozzle 108 is disposed above the top surface of the wafer 126 by the height H1. In an embodiment, a pressure P1 of the nozzle 108 (also referred to subsequently as the plasma inlet) may be in a range from 1 torr to 20 torr. The pressure P1 is dependent on both plasma and gas flow rates through the nozzle 108. The vacuum pump 120 is connected to the gas exhaust 109 between the outer annulus 110 and the nozzle 108, and is used to maintain a pressure P2 in the gas exhaust 109. In an embodiment, the pressure P2 in the gas exhaust 109 may be in a range from 0 torr to 2 torr. The vacuum pump 122 is connected to the plasma processing chamber 114 through a gas outlet, and the vacuum pump 122 helps to maintain a pressure P3 in the regions 115 (shown previously in FIG. 1) of the plasma processing chamber 114. The pressure P3 may also be referred to subsequently as chamber pressure and may be in a range from 1 torr to 100 torr.

In various embodiments, the ratio of the pressure P3 to the pressure P2 may vary in a range from 2:1 to 100:1, for example, 10:1 to 20:1 in one embodiment. The relative pressure difference between the pressures P2 and P3 ensures that the flow 119 of plasma and byproducts travels relatively vertically upward and can be evacuated from the plasma processing chamber 114 through the gas exhaust 109.

During an etching process to etch material from the wafer 126, plasma and reactive species are ejected from the exit of the nozzle 108 in the form of the plasma stream 112 (described previously in FIG. 1) towards the top surface of the wafer 126. The plasma stream 112 travels away from the exit of the nozzle 108 (e.g., in a vertically downward direction) until it encounters the top surface of the wafer 126 that is to be etched. Unreacted plasma (and reactive species), as well as gases and by-products generated from the etching process of the wafer 126 may tend to travel in the form of flow 119 to the 115 regions of the plasma processing chamber 114.

The vacuum pump 120 is used to maintain the pressure P2 in the gas exhaust 109, and the vacuum pump 122 is used to maintain the pressure P3 in the regions 115 (shown previously in FIG. 1) of the plasma processing chamber 114. The pressure P1 of the nozzle 108 is maintained by setting appropriate plasma and gas flow rates through the nozzle 108. The pressure P2 in the gas exhaust 109 is maintained to be lower than the pressure P3 of the regions 115 (shown previously in FIG. 1) of the plasma processing chamber 114.

In various embodiments, when the ratio of the pressure P3 to the pressure P2 varies in a range from 2:1 to 100:1, for example, 10:1 to 20:1 in one embodiment, advantages can be achieved. These advantages include the ability to control plasma flow immediately after impacting the wafer 126, and the immediate removal of all the unreacted plasma (and reactive species) from the plasma processing chamber 114 through the gas exhaust 109 that is adjacent to the nozzle 108. This ensures that the unreacted plasma (and reactive species) only interacts with a reduced area (e.g., a first region) of the top surface of the wafer 126 before being removed from the plasma processing chamber 114. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process.

In an embodiment in which the outer annulus 110 has the outer diameter D3 and the internal diameter D4 as described above, when the pressure P2 in the gas exhaust 109 is maintained to be lower than the pressure P3 in the regions 115 (shown previously in FIG. 1) of the plasma processing chamber 114, and a difference between the pressure P3 and the pressure P2 is maintained to be in a range from 50 torr and 100 torr, an entirety of the flow 119 will travel vertically upward and be evacuated from the plasma processing chamber 114 through the gas exhaust 109. The flow 119 comprises unreacted plasma (and reactive species), as well as gases and by-products generated from the etching process of the wafer 126. In addition, there will also be a flow of gases (flow 121) from the regions 115 of the plasma processing chamber 114 through the gas exhaust 109 and out of the plasma processing chamber 114. Therefore, when the pressure P1 in the nozzle 108, the pressure P2 in the gas exhaust 109, and the pressure P3 of the regions 115 of the plasma processing chamber 114 are properly calibrated, the gas exhaust 109 functions as an adjacent exhaust through which all unreacted plasma (and reactive species), as well as gases and by-products generated during the etching process of the wafer 126 are removed from the plasma processing chamber 114. The unreacted plasma (and reactive species), as well as gases and the by-products generated during the etching process of the wafer 126 are removed in the form of the flow 119.

Advantages can be achieved by performing an etching process on the wafer 126 using a plasma processing system 100 that comprises the outer annulus 110 and the nozzle 108, the nozzle 108 being disposed inside and surrounded by the outer annulus 110. In addition, the plasma processing system 100 is used for the maintaining of the pressure P1 in the nozzle 108, the pressure P2 in the gas exhaust 109, and the pressure P3 in the regions 115 of the plasma processing chamber 114 during the etching process, such that the pressure P2 in the gas exhaust 109 is lower than the pressure P3 in the regions 115 of the plasma processing chamber 114, and a difference between the pressure P3 and the pressure P2 is maintained to be a range between 50 torr and 100 torr. These advantages include the ability to control plasma flow immediately after impacting the wafer 126, and the immediate removal of all the unreacted plasma (and reactive species) from the plasma processing chamber 114 through the gas exhaust 109 that is adjacent to the nozzle 108. This ensures that the unreacted plasma (and reactive species) only interacts with a reduced area (e.g., a first region) of the top surface of the wafer 126 before being removed from the plasma processing chamber 114. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process. If the pressure P2 in the gas exhaust 109 is lower than the pressure P3 in the regions 115 of the plasma processing chamber 114, and the difference between the pressure P3 and the pressure P2 is smaller than 50 torr, flow 119 (e.g., including unreacted plasma (and reactive species)) will travel into the gas exhaust 109 as well as flow into the regions 115 of the plasma processing chamber 114. This will expose surrounding regions (e.g., other regions that surround the first region) of the wafer 126 to flow 119 and result in etch damage from the unreacted plasma (and the reactive species) to these surrounding regions. If the pressure P2 in the gas exhaust 109 is lower than the pressure P3 in the regions 115 of the plasma processing chamber 114, and the difference between the pressure P3 and the pressure P2 is larger than 100 torr, the plasma flowing through the nozzle 108 will be unable to flow effectively from the nozzle 108 and the formation of the plasma stream 112 will be negatively affected. This will result in degraded etching performance of the etching process on the wafer 126.

Further advantages can be achieved by performing the etching process on the wafer 126 using a plasma processing system 100 that comprises the outer annulus 110 and the nozzle 108 as described above, and in which the bottommost surface (e.g., the exit) of the nozzle 108 is above the top surface of the wafer 126 by a height H1 that is in a range from 0.5 mm to 20 mm, and the bottommost surface of the outer annulus 110 is above the top surface of the wafer 126 by a height H2 that is in a range from 0.5 mm to 20 mm. In this way, bottom portions of the sidewalls of the outer annulus 110 are below the sidewalls of the nozzle 108. These advantages include aiding and guiding all unreacted plasma (and reactive species), as well as gases and by-products generated during the etching process of the wafer 126 into the gas exhaust 109 to be removed from the plasma processing chamber 114.

Figure 3:
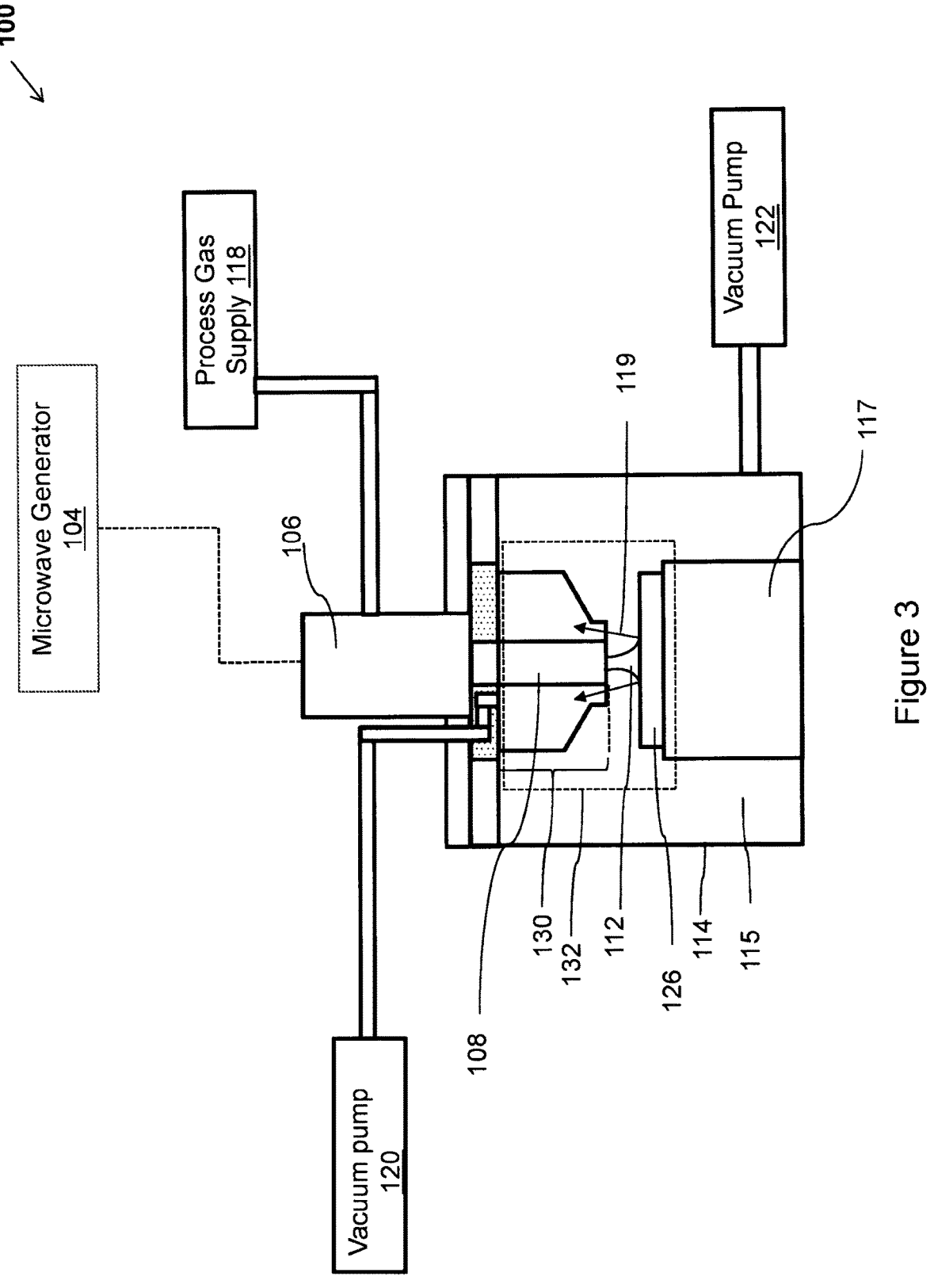
FIG. 3 illustrates a block diagram of a plasma processing system, in accordance with embodiments of the present disclosure.

FIG. 3 illustrates a schematic cross-sectional view of the plasma processing system 100 in accordance with an alternate embodiment. The plasma processing system 100 of FIG. 3 includes features described previously in FIGS. 1 and 2, as well as additional features to provide further advantages. Unless specified otherwise, like reference numerals discussed in this embodiment (and subsequently discussed embodiments) represent like components described and shown previously in FIGS. 1 and 2, and formed by like processes. Accordingly, the process steps and applicable materials may not be repeated herein.

The plasma processing system 100 shown in FIG. 3 may differ to the plasma processing system shown in FIGS. 1 and 2 in that the plasma processing system 100 does not comprise the outer annulus 110 described in FIGS. 1 and 2. Instead, the plasma processing system 100 of FIG. 3 comprises a gas shroud 130 (which may also be referred to subsequently as an outer annulus).

The plasma and reactive species generated in the plasma source 106 flow into the plasma processing chamber 114 through the nozzle 108 as described previously in FIGS. 1 and 2. An exit of the nozzle 108 is positioned over the wafer support 117 (e.g., a wafer vacuum chuck, or the like) in the plasma processing chamber 114. The wafer support 117 is configured to hold the wafer 126 (or for example, a substrate, or the like) to be etched, so that the reactive species and the plasma are ejected from the exit of the nozzle 108 towards a top surface of the wafer 126. In an embodiment, the wafer support 117 is capable of rotating the wafer 126 while an etch process is being performed on the wafer 126. The plasma and the reactive species are directed towards the top surface of the wafer 126 in the form of the plasma stream 112 at the exit of the nozzle 108, in a manner that was described previously in FIGS. 1 and 2. The nozzle 108 (which may also be referred to subsequently as the inner annulus) comprises a tube or pipe with an annular cross-section. For example, the nozzle 108 may comprise a hollow cylindrical structure with a circular cross-section, with an open space or hole in the center, resulting in a ring-shaped cross-section. The nozzle 108 may have an outer diameter D5 (shown subsequently in FIG. 4) between outermost sidewalls of the nozzle 108. The nozzle 108 may have an internal diameter D6 (shown subsequently in FIG. 4) between innermost sidewalls of the nozzle 108. In an embodiment, the nozzle 108 may comprise a material that is unreactive or inert to the plasma it delivers towards a top surface of the wafer 126. For example, the nozzle 108 may comprise sapphire, tungsten, or a ceramic (e.g., silicon carbide, alumina, yttria, or the like).

The plasma processing system 100 may also comprise the gas shroud 130 (which may also be referred to subsequently as an outer annulus). The gas shroud 130 may comprise a tube or pipe with an annular cross-section. For example, the gas shroud 130 may comprise a hollow cylindrical structure with a circular cross-section, with an open space or hole in the center, resulting in a ring-shaped cross-section. The nozzle 108 is vertically disposed inside the gas shroud 130, such that the gas shroud 130 surrounds the nozzle 108. The gas shroud 130 can have different cross-sectional diameters, such that an outer diameter between outermost sidewalls of the gas shroud 130 may vary vertically along the axis (also referred to subsequently as the length) of the gas shroud 130. For example, the gas shroud 130 may comprise a first portion of the gas shroud 130*a*, a second portion of the gas shroud 130*b*, and a third portion of the gas shroud 130*c*, where the first portion of the gas shroud 130*a* has a first outer diameter (e.g., an outer diameter D8 shown subsequently in FIG. 4) that is constant, a third portion of the gas shroud 130*c* has a second outer diameter (e.g., an outer diameter D10 shown subsequently in FIG. 4) that is constant, and wherein the second outer diameter is larger than the first outer diameter. The second portion of the gas shroud 130*b* is disposed between and connects the first portion of the gas shroud 130*a* to the third portion of the gas shroud 130*c*, such that the second portion of the gas shroud 130*b* has a third outer diameter that varies along the axis (also referred to subsequently as the length) of the second portion of the gas shroud 130*b*. The third outer diameter has a value that varies from a value that is equal to the first outer diameter at one end of the second portion of the gas shroud 130*b*, to a value that is equal to the second outer diameter at a second end of the second portion of the gas shroud 130*b*.

The first outer diameter and the second outer diameter of the second portion of the gas shroud 130 are larger than the outer diameter D5 of the nozzle 108. The nozzle 108 is disposed inside the gas shroud 130 such that a gas exhaust 109 is formed between inner sidewalls of the gas shroud 130 and the outer sidewalls of the nozzle 108. The gas exhaust 109 comprises a space or gap between the inner sidewalls of the gas shroud 130 and the outer sidewalls of the nozzle 108. The gas exhaust 109 surrounds a perimeter of the outer sidewalls of the nozzle 108. In an embodiment, unreacted plasma (and reactive species), as well as gases and by-products generated during plasma processing of the wafer 126 are removed from the plasma processing chamber 114 through the gas exhaust 109. In an embodiment, the gas shroud 130 may comprise a material such as stainless steel. In other embodiments, the gas shroud 130 may comprise a chemically resistant high-temperature alloy, or the like.

A vacuum pump 120 is connected to the gas exhaust 109 of the gas shroud 130 and is used to remove unreacted plasma (and reactive species), as well as gases and by-products generated during plasma processing of the wafer 126 up through the gas exhaust 109 and out of the plasma processing chamber 114 through one or more gas outlets. The gas exhaust 109 between the inner sidewalls of the gas shroud 130 and the outer sidewalls of the nozzle 108 is therefore an outlet or exhaust through which unreacted plasma (and reactive species), as well as gases and by-products generated during plasma processing of the wafer 126 are removed from the plasma processing chamber 114.

Figure 4:
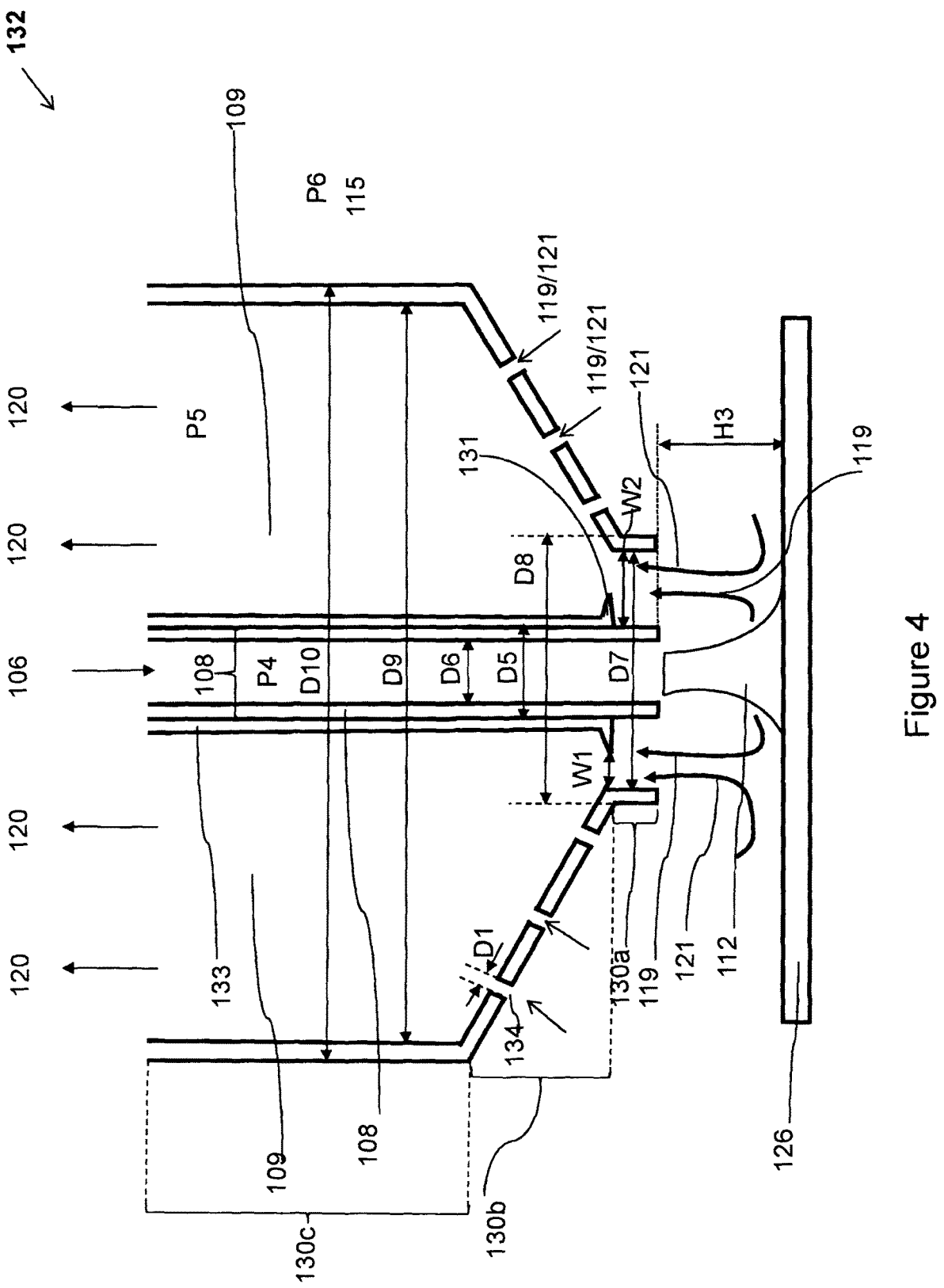
FIG. 4 illustrates a cross-sectional view of a region of the plasma processing system that was shown in FIG. 3, in accordance with embodiments of the present disclosure.

FIG. 4 shows a cross-sectional view of a region 132 of the plasma processing system 100 that was shown previously in FIG. 3. The gas shroud 130 and the nozzle 108 are shown as being disposed over the wafer 126 in the plasma processing chamber 114. Specifically, the nozzle 108 and the gas shroud 130 are disposed to be over an area of the wafer 126 that is to be etched. The gas shroud 130 may comprise a material such as stainless steel. In other embodiments, the gas shroud 130 may comprise a chemically resistant-high temperature alloy, or the like. The nozzle 108 may comprise a material such as sapphire, tungsten, or a ceramic (e.g., silicon carbide, alumina, yttria, or the like). It should be noted that even though the gas shroud 130 and the nozzle 108 are described as being used in context of an etching process, the embodiments described herein (including the gas shroud 130 and the nozzle 108) may be used in the context of other types of plasma operations. These operations include ashing, deposition, cleaning, plasma polymerization, plasma-enhanced chemical vapor deposition (PECVD), plasma-enhanced atomic layer deposition (PEALD) and so forth.

As illustrated in various embodiments, the nozzle 108 (which may also be referred to subsequently as the inner annulus) comprises a tube or pipe with an annular cross-section. For example, the nozzle 108 may comprise a hollow cylindrical structure with a circular cross-section, with an open space or hole in the center, resulting in a ring-shaped cross-section. The nozzle 108 may have the outer diameter D5 between outermost sidewalls of the nozzle 108. The nozzle 108 may have the internal diameter D6 between innermost sidewalls of the nozzle 108. In an embodiment, the outer diameter D5 is in a range from 6 mm to 25 mm, and the internal diameter D6 is in a range from 5 mm to 20 mm.

The gas shroud 130 (which may also be referred to subsequently as the outer annulus) may comprise a tube or pipe with an annular cross-section. For example, the gas shroud 130 may comprise a hollow cylindrical structure with a circular cross-section, with an open space or hole in the center, resulting in a ring-shaped cross-section. The nozzle 108 is vertically disposed inside the gas shroud 130, such that the gas shroud 130 surrounds the nozzle 108. The gas shroud 130 can have different cross-sectional diameters, such that an outer diameter between outermost sidewalls of the gas shroud 130 may vary vertically along the axis (also referred to subsequently as the length) of the gas shroud 130. For example, the gas shroud 130 may comprise a first portion of the gas shroud 130a, a second portion of the gas shroud 130b, and a third portion of the gas shroud 130c, where the first portion of the gas shroud 130a may have an internal diameter D7 between innermost sidewalls of the first portion of the gas shroud 130a, and the outer diameter D8 between outermost sidewalls of the first portion of the gas shroud 130a. The internal diameter D7 and the outer diameter D8 may be constant along the axis (also referred to subsequently as the length) of the first portion of the gas shroud 130a. The third portion of the gas shroud 130c may have an internal diameter D9 between innermost sidewalls of the third portion of the gas shroud 130c, and the outer diameter D10 between outermost sidewalls of the third portion of the gas shroud 130c. The internal diameter D9 and the outer diameter D10 may be constant along the axis (also referred to subsequently as the length) of the third portion of the gas shroud 130c. The second portion of the gas shroud 130b is disposed between and connects the first portion of the gas shroud 130a to the third portion of the gas shroud 130c, such that the second portion of the gas shroud 130b has an outer diameter and an internal diameter that varies along the axis (also referred to subsequently as the length) of the second portion of the gas shroud 130b. The outer diameter of the second portion of the gas shroud 130b has a value that varies from a value that is equal to the outer diameter D8 at a first end of the second portion of the gas shroud 130b, to a value that is equal to the outer diameter D10 at a second end of the second portion of the gas shroud 130b. The internal diameter of the second portion of the gas shroud 130b has a value that varies from a value that is equal to the internal diameter D7 at the first end of the second portion of the gas shroud 130b, to a value that is equal to the internal diameter D9 at the second end of the second portion of the gas shroud 130b.

In an embodiment, the internal diameter D7 may be in a range from 20 mm to 60 mm, the outer diameter D8 may be in a range from 21 mm to 65 mm, the internal diameter D9 may be in a range from 40 mm to 100 mm, and the outer diameter D10 may be in a range from 41 mm to 110 mm. In an embodiment, the first portion of the gas shroud 130a is closer to the wafer 126 than the second portion of the gas shroud 130b, and the third portion of the gas shroud 130c. In an embodiment, the internal diameter D7, the outer diameter D8, the internal diameter D9, and the outer diameter D10 are larger than the outer diameter D5 and the internal diameter D6. In an embodiment, the outer diameter D10 is larger than the outer diameter D8, and the internal diameter D9 is larger than the internal diameter D7.

In an embodiment, the gas shroud 130 may also comprises a sleeve 133, which may tube or pipe with an annular cross-section. For example, the sleeve 133 may comprise a hollow cylindrical structure with a circular cross-section, with an open space or hole in the center, resulting in a ring-shaped cross-section. The sleeve 133 is designed to be fitted around and be in physical contact with outer sidewalls of the nozzle 108. In this way, the sleeve 133 is disposed to be fitted around, and be in physical contact with a top portion of the nozzle 108. A bottom portion of the nozzle 108 extends below bottommost surfaces of the sleeve 133. The sleeve 133 may comprise a flange 131 around the perimeter of the sleeve 133, where the flange 131 protrudes in a direction that is orthogonal to the innermost sidewalls of the first portion of the gas shroud 130a. In an embodiment, an opening between the innermost sidewalls of the first portion of the gas shroud 130a and the flange 131 has a width W1. In an embodiment, the gas shroud 130, may or may not comprise the sleeve 133. In an embodiment where no sleeve 133 is disposed to be fitted around the nozzle 108, a width W2 between the innermost sidewalls of the first portion of the gas shroud 130a and the nozzle 108 may be in a range from 1 mm to 30 mm. In an embodiment, the sleeve 133 may comprise a metal, such as stainless steel, a high-temperature plasma-resistant alloy or the like.

The gas shroud 130 may be disposed such that bottommost surfaces of the gas shroud 130 (e.g., the first portion of the gas shroud 130) are level with bottommost surfaces (e.g., an exit) of the nozzle 108. In other embodiments, the bottommost surfaces of the gas shroud 130 are not level with the bottommost surfaces (e.g., an exit) of the nozzle 108. The bottommost surface of the gas shroud 130 may be above the top surface of the wafer 126 by a height H3 that is in a range from 1 mm to 30 mm. The nozzle 108 is disposed inside the gas shroud 130 such that a gas exhaust 109 (also referred to as a space) is formed between the inner sidewalls of the gas shroud 130 and the outer sidewalls of the nozzle 108, and between inner sidewalls of the gas shroud 130 and outer sidewalls of the sleeve 133. The gas exhaust 109 surrounds a perimeter of the outer sidewalls of the nozzle 108 and the sleeve 133. For example, a first portion of the gas exhaust 109 comprises a space between the innermost sidewalls of the first portion of the gas shroud 130a and the outermost sidewalls of the nozzle 108, as well as a space between the innermost sidewalls of the first portion of the gas shroud 130a and the sleeve 133 (including the flange 131). A second portion of the gas exhaust 109 comprises a space between the innermost sidewalls of the second portion of the gas shroud 130b and the sleeve 133. A third portion of the gas exhaust 109 comprises a space between the innermost sidewalls of the third portion of the gas shroud 130c and the sleeve 133. In an embodiment, a volume of the space of the third portion of the gas exhaust 109 is larger than a volume of the space of the second portion of the gas exhaust 109 and a volume of the first portion of the gas exhaust 109.

The plasma and reactive species which flow into the plasma processing chamber 114 from the plasma source 106 travel through the nozzle 108. The exit of the nozzle 108 is disposed above the top surface of the wafer 126. The pressure P4 is dependent on both plasma and gas flow rates through the nozzle 108. The vacuum pump 120 is connected to the gas exhaust 109 in the gas shroud 130 and is used to maintain a pressure P5 in the gas exhaust 109 (also referred to subsequently as the exhaust). In an embodiment the pressure P5 in the gas exhaust 109 may be in a range from 0 torr to 100 torr. The vacuum pump 122 is connected to the plasma processing chamber 114 through a gas outlet, and the vacuum pump 122 helps to maintain a pressure P6 in the regions 115 (shown previously in FIG. 3) of the plasma processing chamber 114. The pressure P6 may also be referred to subsequently as chamber pressure and may be in a range from 10 torr to 200 torr. The gas shroud 130 is disposed above the top surface of the wafer 126 by the height H3 that is in a range from 1 mm to 30 mm.

During an etching process to etch material from the wafer 126, plasma and reactive species are ejected from the exit of the nozzle 108 in the form of the plasma stream 112 (described previously in FIGS. 1 and 3) towards the top surface of the wafer 126. The plasma stream 112 travels away from the exit of the nozzle 108 (e.g., in a vertically downward direction) until it encounters the top surface of the wafer 126 that is to be etched. Unreacted plasma (and reactive species), as well as gases and by-products generated from the etching process of the wafer 126 may tend to travel in the form of flow 119 to the regions 115 of the plasma processing chamber 114.

The vacuum pump 120 is used to maintain the pressure P5 in the gas exhaust 109, and the vacuum pump 122 is used to maintain the pressure P6 in the regions 115 (shown previously in FIG. 3) of the plasma processing chamber 114. The pressure P4 of the nozzle 108 is maintained by setting appropriate plasma and gas flow rates through the nozzle 108. The pressure P5 in the gas exhaust 109 is maintained to be lower than the pressure P6 of the regions 115 (shown previously in FIG. 3) of the plasma processing chamber 114. In various embodiments, the ratio of the pressure P6 to the pressure P5 may vary in a range from 2:1 to 100:1, for example, 10:1 to 20:1 in one embodiment. The relative pressure difference between the pressures P6 and P5 ensures that the flow 119 of plasma and byproducts travels relatively vertically upward and can be evacuated from the plasma processing chamber 114 through the gas exhaust 109.

In various embodiments, when the ratio of the pressure P6 to the pressure P5 varies in a range from 2:1 to 100:1, for example, 10:1 to 20:1 in one embodiment, advantages can be achieved. These advantages include the ability to control plasma flow immediately after impacting the wafer 126, and the immediate removal of all the unreacted plasma (and reactive species) from the plasma processing chamber 114 through the gas exhaust 109 that is adjacent to the nozzle 108. This ensures that the unreacted plasma (and reactive species) only interacts with a reduced area (e.g., a first region) of the top surface of the wafer 126 before being removed from the plasma processing chamber 114. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process.

In an embodiment, when the pressure P5 in the gas exhaust 109 is maintained to be lower than the pressure P6 in the regions 115 (shown previously in FIG. 3) of the plasma processing chamber 114, and a difference between the pressure P6 and the pressure P5 is maintained to be in a range from 50 torr and 200 torr, an entirety of the flow 119 will travel vertically upward and be evacuated from the plasma processing chamber 114 through the gas exhaust 109. The flow 119 comprises unreacted plasma (and reactive species), as well as gases and by-products generated from the etching process of the wafer 126. In addition, there will also be a flow of gases (flow 121) from the regions 115 of the plasma processing chamber 114 through the gas exhaust 109 and out of the plasma processing chamber 114. Therefore, when the pressure P4 in the nozzle 108, the pressure P5 in the gas exhaust 109, and the pressure P6 of the regions 115 of the plasma processing chamber 114 are properly calibrated, the gas exhaust 109 functions as an adjacent exhaust through which all unreacted plasma (and reactive species), as well as gases and by-products generated during the etching process of the wafer 126 are removed from the plasma processing chamber 114. The unreacted plasma (and reactive species), as well as the gases and the by-products generated during the etching process of the wafer 126 are removed in the form of the flow 119.

Advantages can be achieved by performing an etching process on the wafer 126 using a plasma processing system 100 that comprises the gas shroud 130 and the nozzle 108, the nozzle 108 being disposed inside and surrounded by the gas shroud 130. In addition, the plasma processing system 100 is used for the maintaining of the pressure P4 in the nozzle 108, the pressure P5 in the gas exhaust 109, and the pressure P6 in the regions 115 of the plasma processing chamber 114 during the etching process, such that the pressure P5 in the gas exhaust 109 is lower than the pressure P6 in the regions 115 of the plasma processing chamber 114, and a difference between the pressure P6 and the pressure P5 is maintained to be a range between 50 torr and 100 torr. These advantages include the ability to control plasma flow immediately after impacting the wafer 126, and the immediate removal of all the unreacted plasma (and reactive species) from the plasma processing chamber 114 through the gas exhaust 109 that is adjacent to the nozzle 108. This ensures that the unreacted plasma (and reactive species) only interacts with a reduced area (e.g., a first region) of the top surface of the wafer 126 before being removed from the plasma processing chamber 114. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process.

In an embodiment, and as illustrated in FIG. 4, the second portion of the gas shroud 130b may comprise porous sidewalls. For example, the sidewalls of the second portion of the gas shroud 130b may have a plurality of orifices 134 that directly connect and allow flow of gas between the gas exhaust 109 and the regions 115 of the plasma processing chamber 114. The plurality of orifices 134 may be equidistantly spaced and each of the plurality of orifices 134 may have a diameter D1 that is in a range form 0.5 mm to 3 mm. In an embodiment, the third portion of the gas shroud 130b may also comprise sidewalls having the plurality of orifices 134. When the pressure P5 in the gas exhaust 109 is maintained to be lower than the pressure P6 in the regions 115 (shown previously in FIG. 3) of the plasma processing chamber 114, the flow 119 will travel vertically upward through the opening having the width W1 between the innermost sidewalls of the first portion of the gas shroud 130a and the flange 131, as well as through the plurality of orifices 134, and be evacuated from the plasma processing chamber 114 through the gas exhaust 109. The flow 119 comprises unreacted plasma (and reactive species), as well as gases and by-products generated from the etching process of the wafer 126. In addition, there will also be a flow of gases (flow 121) from the regions 115 of the plasma processing chamber 114 through the opening having the width W1 between the innermost sidewalls of the first portion of the gas shroud 130a and the flange 131, as well as through the plurality of orifices 134, and out of the plasma processing chamber 114.

Advantages can be achieved by performing the etching process on the wafer 126 using a plasma processing system 100 that comprises the gas shroud 130 and the nozzle 108 as described above, and in which the second portion of the gas shroud 130b comprises sidewalls having the plurality of orifices 134 that directly connect and allow flow of gas between the gas exhaust 109 and the regions 115 of the plasma processing chamber 114. When the pressure P5 in the gas exhaust 109 is maintained to be lower than the pressure P6 in the regions 115 (shown previously in FIG. 3) of the plasma processing chamber 114, the flow 119 will travel vertically upward through the opening having the width W1 between the innermost sidewalls of the first portion of the gas shroud 130a and the flange 131, as well as through the plurality of orifices 134, and be evacuated from the plasma processing chamber 114 through the gas exhaust 109. The flow 119 comprises unreacted plasma (and reactive species), as well as gases and by-products generated from the etching process of the wafer 126. The flow 119 will therefore have multiple avenues to travel through to reach the gas exhaust 109, and this will allow for a smoother flow 119 with reduced turbulence and friction as the flow 119 travels into the gas exhaust 109, and then out of the plasma processing chamber 114.

Additional advantages can be achieved by performing the etching process on the wafer 126 using the plasma processing system 100 that comprises the gas shroud 130 and the nozzle 108 as described above, and in which the bottommost surface of the gas shroud 130 (e.g., the first portion of the gas shroud 130a) is above the top surface of the wafer 126 by the height H3 that is in a range from 1 mm to 30 mm. These advantages include the ability to enhance the aiding and guiding of all unreacted plasma (and reactive species), as well as gases and by-products generated during the etching process of the wafer 126 into the gas exhaust 109 to be removed from the plasma processing chamber 114.

Further advantages can also be achieved by performing the etching process on the wafer 126 using the gas shroud 130. The gas shroud 130 comprises the third portion of the gas shroud 130c having the internal diameter D9 that is in a range from 40 mm to 100 mm, and having the outer diameter D10 that is in a range from 41 mm to 110 mm. The gas shroud 130 also comprises the first portion of the gas shroud 130a having the internal diameter D7 that is in a range from 20 mm to 60 mm, and having the outer diameter D8 that is in a range from 21 mm to 65 mm. These dimensions allow the space of the gas exhaust 109 to have an increased volumetric capacity, improving the efficiency of the removal of the unreacted plasma (and reactive species), as well as gases and by-products generated during the etching process of the wafer 126 from the plasma processing chamber 114. In addition, the gas shroud 130 having these dimensions enables the gas shroud 130 to be produced more cost effectively, with reduced production costs as well as an increased ease of manufacture that reduces production times.

Figure 5:
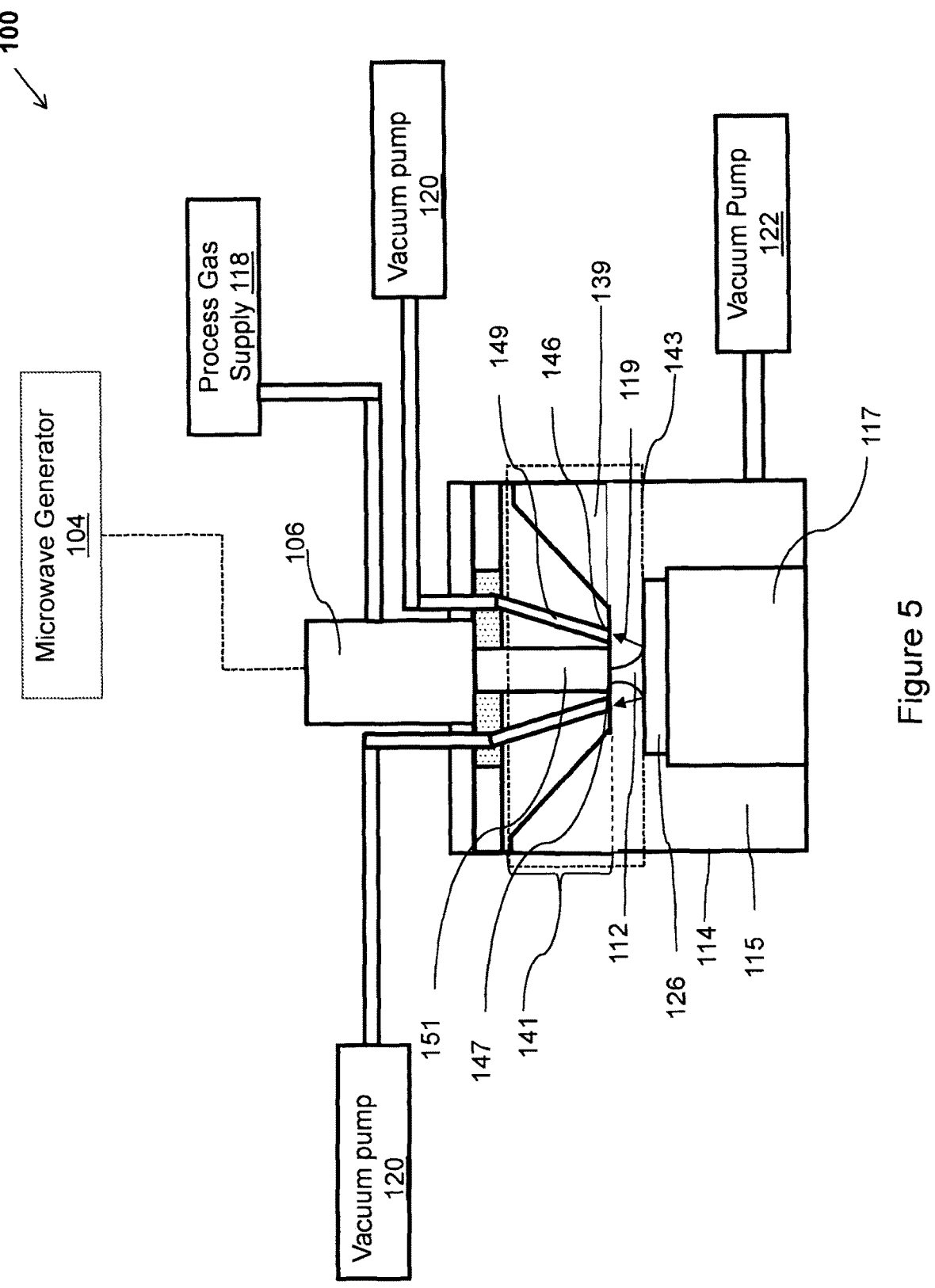
FIG. 5 illustrates a block diagram of a plasma processing system, in accordance with embodiments of the present disclosure.
Figures 6A, 6B:
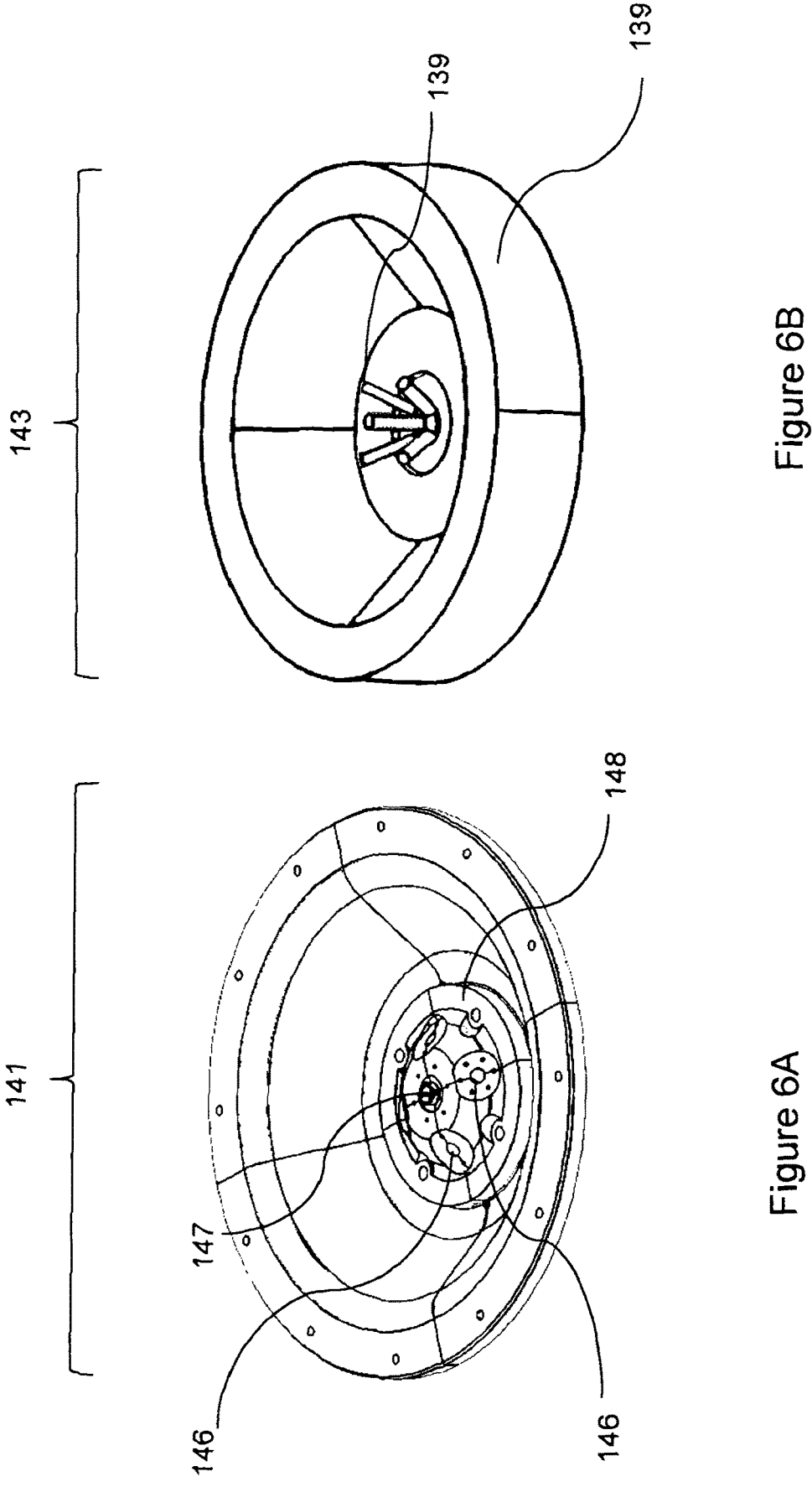
FIG. 6A illustrates a perspective view of a gas shroud of the plasma processing system that was shown in FIG. 5, in accordance with embodiments of the present disclosure.
FIG. 6B illustrates a perspective view of a region of the plasma processing system that was shown in FIG. 5, in accordance with embodiments of the present disclosure.
Figure 7:
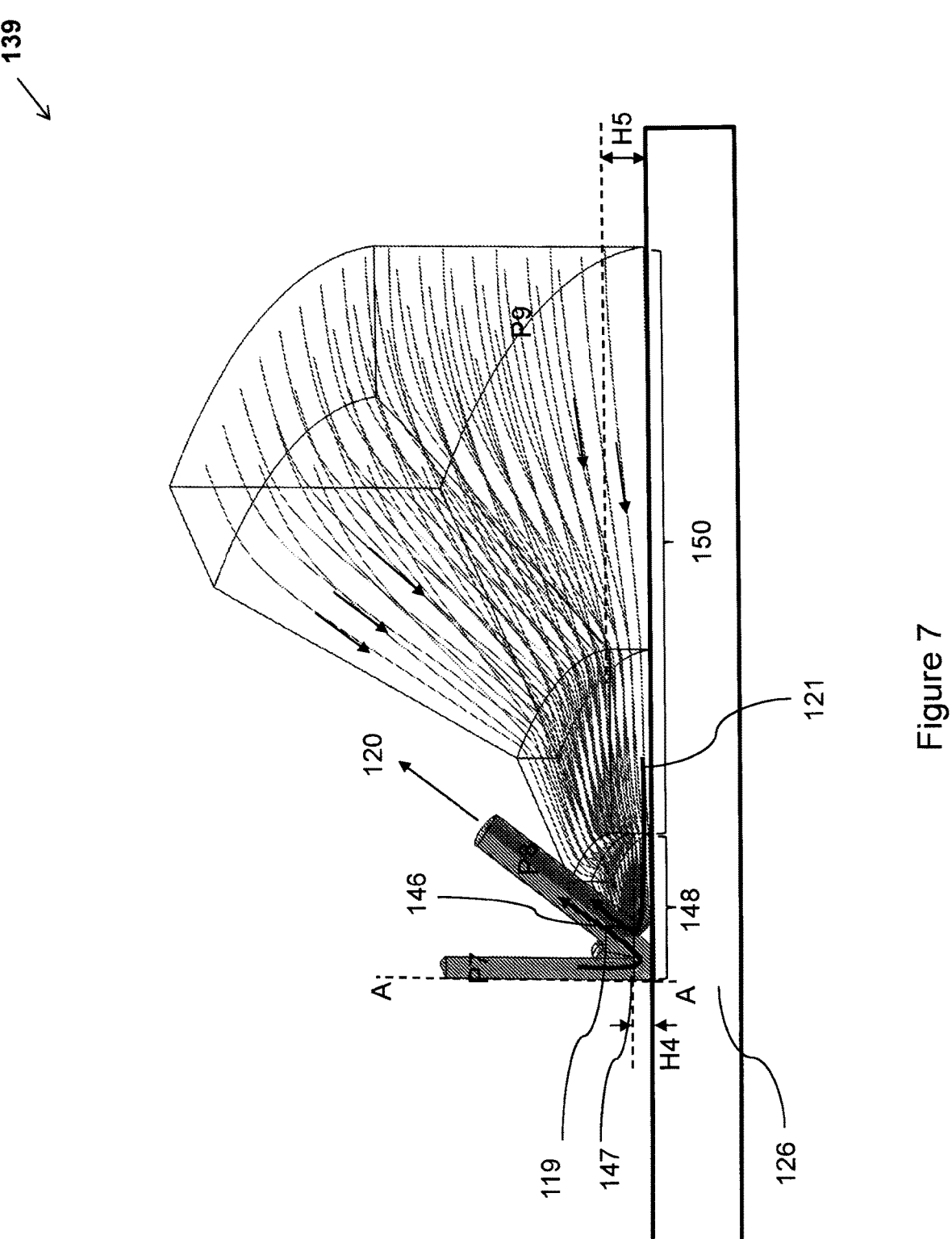
FIG. 7 illustrates a symmetrical section that represents one-eighth of a hollow space of the plasma processing system that was shown in FIG. 5, in accordance with alternate embodiments of the present disclosure.

FIG. 5 illustrates a schematic cross-sectional view of the plasma processing system 100 in accordance with an alternate embodiment. FIG. 6A illustrates a perspective view of a gas shroud 141 of the plasma processing system 100 shown in FIG. 5. FIG. 6B illustrates a perspective view of a region 143 of the plasma processing system 100 shown in FIG. 5. In FIG. 6B, a hollow space 139 is shown that is disposed between the gas shroud 141 and the wafer 126 of the plasma processing system 100 shown in FIG. 5. The hollow space 139 also may include spaces within a plasma nozzle, and exhaust outlets that are connected to and allow gas flow to and from the gas shroud 141. FIG. 7 illustrates a symmetrical section that represents one-eighth of the hollow space 139 that is shown in FIG. 5 and FIG. 6B. The plasma processing system 100 of FIGS. 5-7 includes features described previously in FIGS. 1-4, as well as additional features to provide further advantages. Unless specified otherwise, like reference numerals discussed in this embodiment (and subsequently discussed embodiments) represent like components described and shown previously in FIGS. 1-4, and formed by like processes. Accordingly, the process steps and applicable materials may not be repeated herein.

The plasma processing system 100 shown in FIGS. 5-7 may differ from the plasma processing system shown in FIGS. 1-4 in that the plasma processing system 100 does not comprise the outer annulus 110 described in FIGS. 1-2 or the gas shroud 130 described in FIGS. 3-4. Instead, the plasma processing system 100 of FIG. 5-6 comprises the gas shroud 141.

The gas shroud 141 is disposed in the plasma processing chamber 114, over the wafer support 117 and the wafer 126. The gas shroud 141 (shown in FIG. 6A) may have a circular shape when viewed in a top-down view, with the gas shroud 141 having a concave shape with a flat center portion 148. This means that the gas shroud 141 is curved or sunken around the edges, but the center portion 148 of the gas shroud 141 is flat or level. The center portion 148 is lower than the edges of the gas shroud 141, creating a depression or a bowl-like shape. The gas shroud 141 fits between and is in physical contact with sidewalls of the plasma processing chamber 114, such that the gas shroud 141 is disposed above the wafer 126 and the wafer support 117 (e.g., a wafer vacuum chuck, or the like). The center portion 148 may have an adjustable height, such that a height H4 (as shown in FIG. 7) between a bottom surface of the center portion 148 and a top surface of the wafer 126 is in a range from 2 mm to 30 mm. Outer portions 150 (also referred to subsequently as the baffle) of the gas shroud 141 may surround the center portion 148. Regions of the outer portions 150 that are adjacent to the center portion 148 may have a height H5 (as shown in FIG. 7) between a bottom surface of the adjacent regions and the top surface of the wafer 126, wherein the height H5 is in a range from 2 mm to 50 mm. A hollow space 139 (shown in FIGS. 5, 6B, and 7) is disposed under the curved or concave sidewalls of the gas shroud 141. This hollow space 139 is disposed between the gas shroud 141 and the wafer 126, the hollow space 139 being connected to and allowing gas flow to and from regions 115 (shown in FIG. 5) of the plasma processing chamber 114.

The gas shroud 141 may have a nozzle opening 147 (also referred to subsequently as a plasma inlet), that comprises an opening or hole which is disposed over and extends through the center portion 148. The plasma and reactive species generated in the plasma source 106 flow into the plasma processing chamber 114 using a nozzle 151 (shown in FIG. 5) that may extend through the nozzle opening 147. The nozzle opening 147 is positioned over a wafer support 117

(e.g., a wafer vacuum chuck, or the like) in the plasma processing chamber 114. The wafer support 117 is configured to hold the wafer 126 (or for example, a substrate, or the like) to be etched, so that the reactive species and plasma are ejected from the exit of the nozzle 151 that extends through the nozzle opening 147 towards a top surface of the wafer 126. The plasma and the reactive species are directed towards the top surface of the wafer 126 in the form of a plasma stream 112 at the exit of the nozzle 151. The plasma stream 112 comprises a narrow column or stream of plasma and reactive species. The nozzle 151 that extends through the nozzle opening 147 comprises a tube or pipe with an annular cross-section. For example, the nozzle 151 may comprise a hollow cylindrical structure with a circular cross-section, with an open space or hole in the center, resulting in a ring-shaped cross-section.

The gas shroud 141 may also comprise three or more exhaust openings 146 that are disposed over and extend through the center portion 148. The exhaust openings 146 may be radially disposed around the nozzle opening 147. An exhaust outlet 149 may extend from each of the exhaust openings 146, wherein each exhaust outlet 149 may be slanted relative to a vertical axis of the nozzle 151 that extends through the nozzle opening 147, so as to improve the outflow of the reflected plasma from the wafer. In this way, the exhaust outlets 149 are positioned or oriented around the nozzle 151 in a circular or radiating pattern. In various embodiments, the exhaust outlets 149 may be oriented at angle of 30° to 60° relative to the vertical axis of the nozzle 151. For example, top portions of each exhaust outlet 149 may be further away from a vertical line A-A (shown in FIG. 7) that passes through a center of the nozzle 151 than bottom portions of the exhaust outlet 149. The angle of exhaust outlets 149 may be chosen to improve the outflow of the reflected plasma from the wafer.

Each exhaust outlet 149 comprises a tube or pipe with an annular cross-section. For example, each exhaust outlet 149 may comprise a hollow cylindrical structure with a circular cross-section, with an open space or hole in the center, resulting in a ring-shaped cross-section. Each exhaust outlet 149 may be disposed such that a corresponding exhaust opening 146 is above the top surface of the wafer 126 and adjacent to the exit of the nozzle 151 that extends through the nozzle opening 147. In an embodiment, unreacted plasma (and reactive species), as well as gases and by-products generated during plasma processing of the wafer 126 are removed from the plasma processing chamber 114 through the exhaust outlets 149. In an embodiment, the gas shroud 141 may comprise a material such as stainless steel, a high-temperature plasma-resistant alloy, or the like.

A vacuum pump 120 is connected to each of the exhaust outlets 149 and is used to remove unreacted plasma (and reactive species), as well as gases and by-products generated during plasma processing of the wafer 126 up through the exhaust outlets 149 and out of the plasma processing chamber 114 through a gas outlet. The exhaust outlets 149 are therefore the exhaust through which unreacted plasma (and reactive species), as well as gases and by-products generated during plasma processing of the wafer 126 are removed from the plasma processing chamber 114. The unreacted plasma (and reactive species), as well as the gases and the by-products travel through the exhaust outlets 149 in the form of flow 119 (shown in FIGS. 5 and 7).

The vacuum pump 120 is connected to the exhaust outlets 149 and is used to maintain the pressure P8 in the exhaust outlets 149. The vacuum pump 122 is connected to the plasma processing chamber 114 through a gas outlet, and is used to maintain the pressure P9 in the regions 115 (shown in FIG. 5) of the plasma processing chamber 114 and the hollow space 139. The pressure P7 of the nozzle 151 is maintained by setting appropriate plasma and gas flow rates through the nozzle 151. In an embodiment the pressure P8 in the exhaust outlets 149 may be in a range from 0 torr to 20 torr. The pressure P9 may also be referred to subsequently as chamber pressure and may be in a range from 200 torr to 800 torr. The pressure P8 in the exhaust outlets 149 is maintained to be lower than the pressure P9 of the regions 115 (shown in FIG. 5) of the plasma processing chamber 114 and the hollow space 139. In various embodiments, the ratio of the pressure P9 to the pressure P8 may vary in a range from 2:1 to 100:1, for example, 10:1 to 20:1 in one embodiment. The relative pressure difference between the pressures P9 and P8 ensures that the flow 119 of plasma and byproducts travels relatively vertically upward and can be evacuated from the plasma processing chamber 114 through the exhaust outlets 149.

During an etching process to etch material from the wafer 126, plasma and reactive species are ejected from the exit of the nozzle 151 in the form of the plasma stream 112 towards the top surface of the wafer 126. The plasma stream 112 travels away from the exit of the nozzle 151 (e.g., in a vertically downward direction) until it encounters the top surface of the wafer 126 that is to be etched. Unreacted plasma (and reactive species), as well as gases and by-products generated from the etching process of the wafer 126 may tend to travel in the form of flow 119 to the regions 115 of the plasma processing chamber 114.

In various embodiments, when the ratio of the pressure P9 to the pressure P8 varies in a range from 2:1 to 100:1, for example, 10:1 to 20:1 in one embodiment, advantages can be achieved. These advantages include the ability to control plasma flow immediately after impacting the wafer 126, and the immediate removal of all the unreacted plasma (and reactive species) from the plasma processing chamber 114 through the exhaust outlets 149 that are adjacent to the nozzle 151. This ensures that the unreacted plasma (and reactive species) only interacts with a reduced area (e.g., a first region) of the top surface of the wafer 126 before being removed from the plasma processing chamber 114. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process.

In an embodiment, when the pressure P8 in the exhaust outlets 149 is maintained to be lower than the pressure P9 in the regions 115 (shown previously in FIG. 5) of the plasma processing chamber 114 and the hollow space 139, and a difference between the pressure P9 and the pressure P8 is maintained to be in a range from 200 torr and 800 torr, an entirety of the flow 119 will travel vertically upward and be evacuated from the plasma processing chamber 114 and the hollow space 139 through the exhaust outlets 149. The flow 119 comprises unreacted plasma (and reactive species), as well as gases and by-products generated from the etching process of the wafer 126. In addition, there will also be a flow of gases (flow 121) from the regions 115 of the plasma processing chamber 114 and the hollow space 139, through the exhaust outlets 149 and out of the plasma processing chamber 114. Therefore, when the pressure P7 in the nozzle 151, the pressure P8 in the exhaust outlets 149, and the pressure P9 of the regions 115 of the plasma processing chamber 114 and the hollow space 139 are properly calibrated, the exhaust outlets 149 function as an adjacent exhaust through which all unreacted plasma (and reactive species), as well as gases and by-products generated during the etching process of the wafer 126 are removed from the plasma processing chamber 114 and the hollow space 139. The unreacted plasma (and reactive species), as well as the gases and the by-products generated during the etching process of the wafer 126 are removed in the form of the flow 119.

Advantages can be achieved by performing an etching process on the wafer 126 using a plasma processing system 100 that comprises the gas shroud 141. The gas shroud 141 comprises exhaust openings 146 that are disposed radially around the nozzle opening 147. A nozzle 151 extends through the nozzle opening 147, and exhaust outlets 149 extend from corresponding exhaust openings 146. In addition, the plasma processing system 100 is used for the maintaining of the pressure P7 in the nozzle 151, the pressure P8 in the exhaust outlets 149, and the pressure P9 in the regions 115 of the plasma processing chamber 114 and the hollow space 139 during the etching process, such that the pressure P8 in the exhaust outlets 149 is lower than the pressure P9 in the regions 115 of the plasma processing chamber 114 and the hollow space 139, and a difference between the pressure P9 and the pressure P8 is maintained to be a range between 200 torr and 800 torr. These advantages include the ability to control plasma flow immediately after impacting the wafer 126, and the immediate removal of all the unreacted plasma (and reactive species) from the plasma processing chamber 114 through the exhaust outlets 149 that are adjacent to the nozzle 151. This ensures that the unreacted plasma (and reactive species) only interacts with a reduced area (e.g., a first region) of the top surface of the wafer 126 before being removed from the plasma processing chamber 114. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process.

Figure 8:
FIG. 8 illustrates a symmetrical section that represents one-eighth of a hollow space of a plasma processing system, in accordance with alternate embodiments of the present disclosure.

FIG. 8 illustrates a symmetrical section that represents one-eighth of the hollow space 139 of the gas shroud 141 of the plasma processing system 100. The gas shroud 141 of the plasma processing system 100 of FIG. 8 includes features described previously in FIGS. 5-7, as well as additional features to provide further advantages. Unless specified otherwise, like reference numerals discussed in this embodiment (and subsequently discussed embodiments) represent like components described and shown previously in FIGS. 5-7, and formed by like processes. Accordingly, the process steps and applicable materials may not be repeated herein.

The gas shroud 141 shown in FIG. 8 may differ from the gas shroud 141 shown in FIGS. 5-7 in that the exhaust outlets 149 are omitted, or completely blocked to restrict flow of any gases into and through the exhaust outlets 149. As a result, the flow 119 comprising unreacted plasma (and reactive species), as well as the gases and the by-products generated during the etching process of the wafer 126 is unable to travel through the exhaust outlets 149. This will then force the unreacted plasma (and reactive species), as well as the gases and by-products generated from the etching process of the wafer 126 to tend to travel in the form of flow 119 to the regions 115 of the plasma processing chamber 114 and the hollow space 139.

The center portion 148 of the gas shroud 141 may have an adjustable height, such that during the etching process of the wafer 126, the height H4 (as shown in FIG. 8) is maintained between a bottom surface of the center portion 148 and a top surface of the wafer 126, wherein the height H4 is in a range from 2 mm to 30 mm. Outer portions 150 (also referred to subsequently as the baffle) of the gas shroud 141 may surround the center portion 148. During the etching process of the wafer 126, regions of the outer portions 150 that are adjacent to the center portion 148 may be maintained at the height H5 between the top surface of the wafer 126 and a bottom surface of the adjacent regions, wherein the height H5 is in a range from 2 mm to 50 mm. By maintaining the height H4 and the height H5 as described above, the temperature and the pressure of the flow 119 can be controlled. For example, by maintaining the center portion 148 of the gas shroud 141 at the height H4, and by maintaining the regions of the outer portions 150 that are adjacent to the center portion 148 to be at the height H5, the temperature and the pressure of the flow 119 (e.g., the gases in the flow 119) can both rapidly decrease when the plasma stream 112 impacts the wafer 126. This happens because the gases in the flow 119 rapidly cool when the plasma stream 112 impacts the wafer 126 while under the gas shroud 141, leading to rapid drops of pressure of the gases in the flow 119. At these low temperatures and pressures, the unreacted plasma (and reactive species) of the flow 119 becomes inactive and is unable to etch surrounding regions (e.g., other regions that surround a region to be etched) of the wafer 126 during the etching process.

Figure 9B:
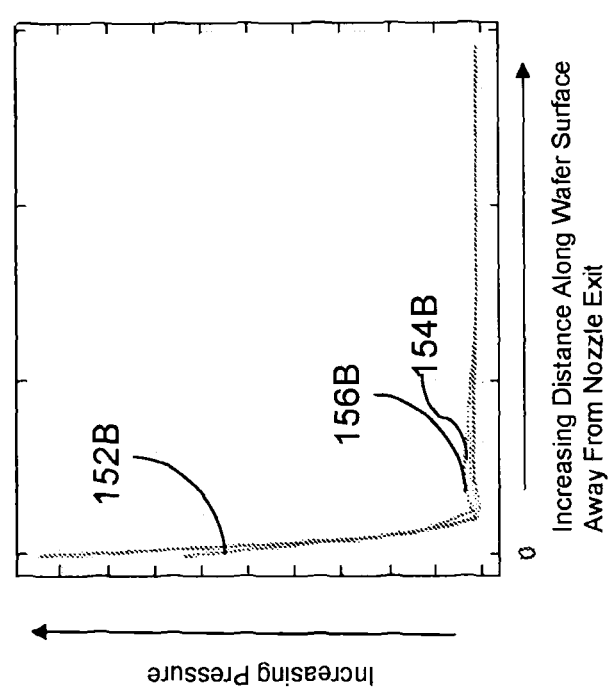
FIG. 9B illustrates example traces of pressure versus distance along a top surface of a wafer during different etching processes, in accordance with alternate embodiments of the present disclosure.
Figure 9A:
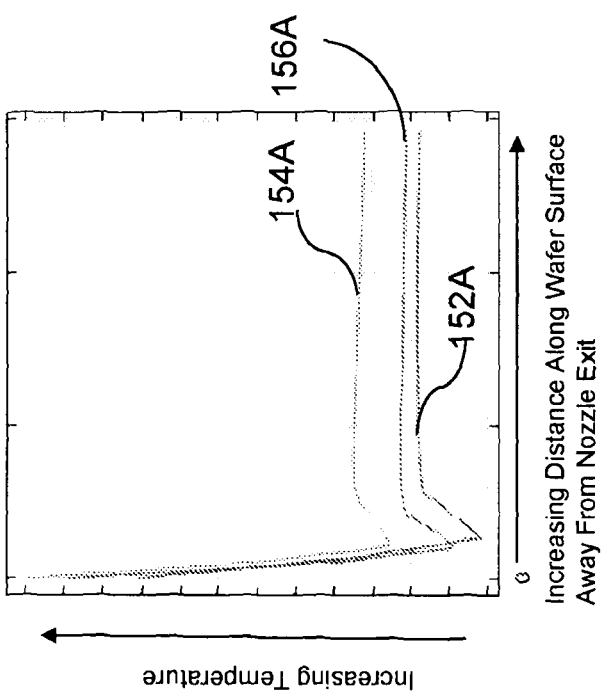
FIG. 9A illustrates example traces of temperature versus distance along a top surface of a wafer during different etching processes, in accordance with alternate embodiments of the present disclosure.

FIG. 9A show traces 152A, 154A, and 156A, which are example traces of temperature versus distance along the top surface of a wafer 126 from a point on the wafer 126 that is vertically under the exit of the nozzle 151. The point on the wafer 126 is being etched using the plasma stream 112 from the exit of the nozzle 151. The traces 152A, 154A, and 156A represent different etching process that are performed on different wafers 126 using the gas shroud 141, wherein during each etching process, a different height is maintained between the top surface of each wafer 126 that is being etched and the bottom surface of regions of the outer portions 150 of the gas shroud 141 that are adjacent to the center portion 148. The trace 152A indicates an etching process during which the largest height is maintained between the top surface of a wafer 126 that is being etched and the bottom surface of the regions of the outer portions 150 of the gas shroud 141 that are adjacent to the center portion 148. The trace 156A indicates an etching process during which the smallest height is maintained between a top surface of a wafer 126 that is being etched and the bottom surface of the regions of the outer portions 150 of the gas shroud 141 that are adjacent to the center portion 148. As can be seen in the traces 152A, 154A, and 156A of FIG. 9A, when using the gas shroud 141, the gases in the flow 119 rapidly cool when the plasma stream 112 impacts each wafer 126, resulting in the unreacted plasma (and reactive species) of the flow 119 becoming inactive within a very short distance from the exit of the nozzle 151 and the plasma stream 112. FIG. 9B shows example traces of pressure versus distance along the top surface of the wafer 126 from a point on the wafer 126 that is vertically under the exit of the nozzle 151. Each of the example traces 152B, 154B, and 156B corresponds to the same etching process that was described by the traces 152A, 154A, and 156A, respectively. As can be seen in the example traces 152B, 154B, and 156B of FIG. 9B, as a result of the gases in the flow 119 rapidly cooling when the plasma stream 112 impacts each wafer 126, a resulting rapid drop in pressure also occurs simultaneously along with the temperature change of the gases in the flow 119.

Advantages can be achieved by performing an etching process of the wafer 126 using a plasma processing system 100 that comprises the gas shroud 141. The gas shroud 141 comprises the nozzle 151 but does not comprise any exhaust outlets 149. During the etching process of the wafer 126, the height H4 is maintained between the bottom surface of the center portion 148 and the top surface of the wafer 126, wherein the height H4 is in a range from 2 mm to 30 mm. In addition, during the etching process on the wafer 126, regions of the outer portions 150 that are adjacent to the center portion 148 are maintained to have the height H5 between the top surface of the wafer 126 and the bottom surface of the adjacent regions, wherein the height H5 is in a range from 2 mm to 50 mm. These advantages include the ability to control plasma flow and properties immediately after impacting the wafer 126. The temperature and the pressure of the flow 119 (e.g., the gases in the flow 119) can both be rapidly reduced when the plasma stream 112 impacts the wafer 126. This happens because the gases in the flow 119 rapidly cool when the plasma stream 112 impacts the wafer 126 while under the gas shroud 141, leading to rapid drops of pressure of the gases in the flow 119. At these low temperatures and pressures, the unreacted plasma (and reactive species) of the flow 119 becomes inactive a short distance away from the plasma stream 112. This ensures that the unreacted plasma (and reactive species) only interacts with a reduced area (e.g., a first region) of the top surface of the wafer 126 before the unreacted plasma (and reactive species) of the flow 119 becomes inactive and is unable to etch the wafer 126 further. This will therefore allow for high-resolution etching, better uniformity across the surface of the wafer 126, and reduced etch damage from the unreacted plasma (and the reactive species) to surrounding regions (e.g., other regions that surround the first region) of the wafer 126 during the etching process.

Although embodiments of the present disclosure and its advantages have been described in detail, it should be understood that various changes, substitutions and alterations can be made herein without departing from the spirit and scope of the disclosure as defined by the appended claims.

Example embodiments of the invention are described below. Other embodiments can also be understood from the entirety of the specification as well as the claims filed herein.

Example 1. A plasma processing apparatus includes a plasma generation source, a nozzle in a plasma chamber, the nozzle being able to direct plasma from the plasma generation source to a wafer that is to be processed. The plasma has the form of a plasma stream at an exit of the nozzle. The plasma processing apparatus also includes an outer annulus disposed in the plasma chamber and over the wafer, the outer annulus surrounding the nozzle, and a gas exhaust disposed between inner sidewalls of the outer annulus and outer sidewalls of the nozzle. The plasma processing apparatus further includes a first vacuum pump connected to the gas exhaust between the inner sidewalls of the outer annulus and the outer sidewalls of the nozzle.

Example 2. The plasma processing apparatus of example 1, further including a second vacuum pump connected to the plasma chamber, the second vacuum pump being configured to maintain the plasma chamber at a second pressure, the first vacuum pump being configured to be maintain the gas exhaust at a first pressure.

Example 3. The plasma processing apparatus of example 2, where the second pressure is higher than the first pressure.

Example 4. The plasma processing apparatus of one of examples 2 to 3, where a ratio of the second pressure to the first pressure is in a range from 10:1 to 20:1.

Example 5. The plasma processing apparatus of one of examples 2 to 4, where the first pressure is in a range from 0 torr to 2 torr, and the second pressure is in a range from 1 torr to 100 torr.

Example 6. The plasma processing apparatus of one of examples 1 to 5, where an outer diameter of the nozzle is in a range from 6 mm to 25 mm, and an outer diameter of the outer annulus is in a range from 8 mm to 40 mm.

Example 7. The plasma processing apparatus of one of examples 1 to 6, where bottom surfaces of the outer annulus are below bottom surfaces of the nozzle.

Example 8. The plasma processing apparatus of one of examples 1 to 7, where an outer diameter of the outer annulus varies vertically along an axis of the outer annulus.

Example 9. A method of plasma processing includes generating a plasma from a plasma source, and directing the plasma into a processing chamber and to an outer surface of a wafer using a nozzle. The plasma exits at an end of the nozzle disposed above the outer surface of the wafer, and the plasma exits in the form of a plasma stream. The nozzle extends through a gas shroud that surrounds the nozzle and that is disposed over the wafer. A gas exhaust is disposed between inner sidewalls of the gas shroud and outer side-walls of the nozzle. The method of plasma processing also includes maintaining a first pressure in the gas exhaust using a first vacuum pump, and maintaining a second pressure in the processing chamber using a second vacuum pump. The first pressure and the second pressure are different.

Example 10. The method of example 9, where the first pressure is lower than the second pressure.

Example 11. The method of one of examples 9 or 10, where a difference between the second pressure and the first pressure is in a range from 50 torr to 200 torr.

Example 12. The method of one of examples 9 to 11, further including after the plasma is directed to the outer surface of the wafer, removing unreacted plasma through the gas exhaust and out of the processing chamber.

Example 13. The method of one of examples 9 to 12, where the gas shroud includes a first portion of the gas shroud that has a first outer diameter that is constant along an axis of the first portion of the gas shroud, a second portion of the gas shroud that has an outer diameter that varies along an axis of the second portion of the gas shroud, and a third portion of the gas shroud that has a second outer diameter that is constant along an axis of the third portion of the gas shroud, where the second portion of the gas shroud is disposed between and connects the first portion of the gas shroud to the third portion of the gas shroud.

Example 14. The method of example 13, where the second outer diameter is larger than the first outer diameter.

Example 15. The method of one of examples 13 or 14, where the second portion of the gas shroud has sidewalls that include orifices, the orifices allowing a flow of gas between the gas exhaust and regions of the processing chamber that are on an opposite side of the sidewalls as the gas exhaust.

Example 16. An apparatus including a plasma source and a gas shroud disposed over a wafer to be processed in a processing chamber. The gas shroud has a concave shape with a flat center portion. The apparatus also includes a nozzle that extends through a first opening in the flat center portion, the nozzle being configured to deliver plasma from the plasma source to an outer surface of the wafer. The apparatus further includes a plurality of exhaust outlets extending from second openings in the flat center portion, the plurality of exhaust outlets being radially disposed around the nozzle.

Example 17. The apparatus of example 16, where the flat center portion is lower than edges of the gas shroud.

Example 18. The apparatus of one of examples 16 or 17, where a height between a top surface of the wafer and a bottom surface of the flat center portion is in a range from 2 mm to 30 mm.

Example 19. The apparatus of one of examples 16 to 18, further including a first vacuum pump connected to the plurality of exhaust outlets, the first vacuum pump being configured to maintain a first pressure in each of the plurality of exhaust outlets, and a second vacuum pump connected to the processing chamber, the second vacuum pump being configured to maintain a second pressure in the processing chamber, wherein the first pressure and the second pressure are different.

Example 20. The apparatus of example 19, where a ratio of the second pressure to the first pressure is in a range from 10:1 to 20:1.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A plasma processing apparatus comprising:
   a plasma generation source;
   a nozzle in a plasma chamber, the nozzle being able to direct plasma from the plasma generation source to a wafer that is to be processed, the plasma having the form of a plasma stream at an exit of the nozzle;
   a gas shroud disposed in the plasma chamber and over the wafer, the gas shroud surrounding the nozzle;
   a gas exhaust disposed between inner sidewalls of the gas shroud and outer sidewalls of the nozzle, wherein a plurality of orifices is disposed in sidewalls of the gas shroud, and wherein each orifice of the plurality of orifices allows for a flow of gas between the gas exhaust and the plasma chamber; and
   a first vacuum pump connected to the gas exhaust between the inner sidewalls of the gas shroud and the outer sidewalls of the nozzle.

2. The plasma processing apparatus of claim 1, further comprising a second vacuum pump connected to the plasma chamber, the second vacuum pump being configured to maintain the plasma chamber at a second pressure, the first vacuum pump being configured to maintain the gas exhaust at a first pressure.

3. The plasma processing apparatus of claim 2, wherein the second pressure is higher than the first pressure.

4. The plasma processing apparatus of claim 2, wherein a ratio of the second pressure to the first pressure is in a range from 10:1 to 20:1.

5. The plasma processing apparatus of claim 2, wherein the first pressure is in a range from 0 torr to 2 torr, and the second pressure is in a range from 1 torr to 100 torr.

6. The plasma processing apparatus of claim 1, wherein an outer diameter of the nozzle is in a range from 6 mm to 25 mm, and an outer diameter of the gas shroud is in a range from 8 mm to 40 mm.

7. The plasma processing apparatus of claim 1, wherein bottom surfaces of the gas shroud are below bottom surfaces of the nozzle.

8. The plasma processing apparatus of claim 1, wherein an outer diameter of the gas shroud varies vertically along an axis of the gas shroud.

9. An apparatus comprising:
   a plasma source;
   a gas shroud disposed over a wafer to be processed in a processing chamber, the gas shroud having a concave shape with a flat center portion;
   a nozzle extending through a first opening in the flat center portion, the nozzle being configured to deliver plasma from the plasma source to an outer surface of the wafer; and
   a plurality of exhaust outlets extending from second openings in the flat center portion, the plurality of exhaust outlets being radially disposed around the nozzle, wherein each exhaust outlet of the plurality of exhaust outlets is oriented at an angle of 30° to 60° relative to a vertical axis of the nozzle.

10. The apparatus of claim 9, wherein the flat center portion is lower than edges of the gas shroud.

11. The apparatus of claim 9, wherein a height between a top surface of the wafer and a bottom surface of the flat center portion is in a range from 2 mm to 30 mm.

12. The apparatus of claim 9, further comprising:
   a first vacuum pump connected to the plurality of exhaust outlets, the first vacuum pump being configured to maintain a first pressure in each of the plurality of exhaust outlets; and
   a second vacuum pump connected to the processing chamber, the second vacuum pump being configured to maintain a second pressure in the processing chamber, wherein the first pressure and the second pressure are different.

13. The apparatus of claim 12, wherein a ratio of the second pressure to the first pressure is in a range from 10:1 to 20:1.

14. A plasma processing apparatus comprising:
   a nozzle in a processing chamber, the nozzle being configured to direct plasma from a plasma generation source to a surface of a wafer in the processing chamber;
   a sleeve fitted around and in physical contact with outer sidewalls of the nozzle, wherein the sleeve comprises a first material, the nozzle comprises a second material, and the first material is different from the second material;
   a gas shroud disposed over the wafer and surrounding the outer sidewalls of the nozzle;
   a gas exhaust disposed between inner sidewalls of the gas shroud and the outer sidewalls of the nozzle, wherein a plurality of orifices is disposed in sidewalls of the gas shroud, and wherein the plurality of orifices allows for a flow of gas between the gas exhaust and the processing chamber;
   a first vacuum pump connected to the gas exhaust, the first vacuum pump being configured to maintain a first pressure in the gas exhaust; and a second vacuum pump connected to the processing chamber, the second vacuum pump being configured to maintain a second pressure in the processing chamber, wherein the first pressure and the second pressure are different.

15. The plasma processing apparatus of claim 14, wherein the gas shroud comprises:

a first portion of the gas shroud that has a first outer diameter that is constant along an axis of the first portion of the gas shroud;

a second portion of the gas shroud that has an outer diameter that varies along an axis of the second portion of the gas shroud; and a third portion of the gas shroud that has a second outer diameter that is constant along an axis of the third portion of the gas shroud, wherein the second portion of the gas shroud is disposed between and connects the first portion of the gas shroud to the third portion of the gas shroud.

16. The plasma processing apparatus of claim 15, wherein the second outer diameter is larger than the first outer diameter.

17. The plasma processing apparatus of claim 14, wherein the second pressure is higher than the first pressure.

18. The plasma processing apparatus of claim 17, wherein a ratio of the second pressure to the first pressure is in a range from 10:1 to 20:1.

19. The plasma processing apparatus of claim 14, wherein the second material of the nozzle comprises sapphire, tungsten, or a ceramic, and the first material of the sleeve comprises stainless steel.

20. The plasma processing apparatus of claim 14, wherein bottommost surfaces of the gas shroud are below bottommost surfaces of the nozzle.

* * * * *